US011908759B2

(12) United States Patent
Chen et al.

(10) Patent No.: US 11,908,759 B2
(45) Date of Patent: Feb. 20, 2024

(54) SEMICONDUCTOR DEVICE

(71) Applicant: MediaTek Inc., Hsin-Chu (TW)

(72) Inventors: Nan-Cheng Chen, Hsin-Chu (TW);
Che-Ya Chou, Kaohsiung (TW);
Hsing-Chih Liu, Taichung (TW);
Che-Hung Kuo, Tainan (TW)

(73) Assignee: MediaTek Inc., Hsin-Chu (TW)

( * ) Notice: Subject to any disclaimer, the term of this patent is extended or adjusted under 35 U.S.C. 154(b) by 207 days.

(21) Appl. No.: 17/190,584

(22) Filed: Mar. 3, 2021

(65) Prior Publication Data

US 2021/0193540 A1 Jun. 24, 2021

Related U.S. Application Data

(62) Division of application No. 15/722,315, filed on Oct. 2, 2017, now abandoned.
(Continued)

(51) Int. Cl.
*H01L 23/31* (2006.01)
*H01L 25/065* (2023.01)
(Continued)

(52) U.S. Cl.
CPC ............ *H01L 23/31* (2013.01); *H01L 23/481* (2013.01); *H01L 23/4824* (2013.01);
(Continued)

(58) Field of Classification Search
CPC ... H01L 23/31; H01L 23/481; H01L 23/4824; H01L 23/5383; H01L 23/5384;
(Continued)

(56) References Cited

U.S. PATENT DOCUMENTS 8,039,303 B2    10/2011  Shim et al.
8,563,403 B1 *  10/2013  Farooq ............... H01L 21/8221
                                                  257/E21.597
(Continued)

FOREIGN PATENT DOCUMENTS

CN       102420180 A    4/2012
CN       103887258 A    6/2014
(Continued)

OTHER PUBLICATIONS

U.S. Appl. No. 15/722,315, filed Oct. 2, 2017, Chen et al.
(Continued)

*Primary Examiner* — Yasser A Abdelaziez
(74) *Attorney, Agent, or Firm* — Wolf, Greenfield & Sacks, P.C.

(57) ABSTRACT

A semiconductor device includes a substrate, a body structure and an electronic component. The body structure is disposed above the substrate and includes a semiconductor die, a molding compound, a conductive component and a lower redistribution layer (RDL). The semiconductor die has an active surface. The molding compound encapsulates the semiconductor die and has a lower surface, an upper surface opposite to the lower surface and a through hole extending to the upper surface from the lower surface. The conductive component is formed within the through hole. The lower RDL is formed on the lower surface of the molding compound, the active surface of the semiconductor die and the conductive component exposed from the lower surface. The electronic component is disposed above the upper surface of the molding compound and electrically connected to the lower RDL through the conductive component.

20 Claims, 11 Drawing Sheets

Related U.S. Application Data

(60) Provisional application No. 62/460,122, filed on Feb. 17, 2017, provisional application No. 62/404,808, filed on Oct. 6, 2016, provisional application No. 62/404,811, filed on Oct. 6, 2016, provisional application No. 62/404,805, filed on Oct. 6, 2016.

(51) Int. Cl.

| | | |
|---|---|---|
| *H01L 23/538* | (2006.01) | |
| *H01L 23/00* | (2006.01) | |
| *H01L 23/48* | (2006.01) | |
| *H01L 23/482* | (2006.01) | |
| *H01L 25/04* | (2023.01) | |
| *H01L 23/14* | (2006.01) | |
| *H01L 25/18* | (2023.01) | |

(52) U.S. Cl.
CPC ...... *H01L 23/5383* (2013.01); *H01L 23/5384* (2013.01); *H01L 23/5389* (2013.01); *H01L 24/20* (2013.01); *H01L 25/043* (2013.01); *H01L 25/0652* (2013.01); *H01L 25/0655* (2013.01); *H01L 23/145* (2013.01); *H01L 23/147* (2013.01); *H01L 23/3128* (2013.01); *H01L 23/3135* (2013.01); *H01L 25/18* (2013.01); *H01L 2224/04105* (2013.01); *H01L 2224/12105* (2013.01); *H01L 2224/131* (2013.01); *H01L 2224/16227* (2013.01); *H01L 2224/16235* (2013.01); *H01L 2224/2518* (2013.01); *H01L 2224/32225* (2013.01); *H01L 2224/73204* (2013.01); *H01L 2224/92125* (2013.01); *H01L 2225/06541* (2013.01); *H01L 2225/1035* (2013.01); *H01L 2225/1041* (2013.01); *H01L 2225/1058* (2013.01); *H01L 2924/10253* (2013.01); *H01L 2924/1434* (2013.01); *H01L 2924/157* (2013.01); *H01L 2924/15311* (2013.01)

(58) Field of Classification Search
CPC . H01L 23/5389; H01L 23/145; H01L 23/147; H01L 23/3128; H01L 23/3135; H01L 24/20; H01L 25/18; H01L 25/043; H01L 25/0652; H01L 25/0655; H01L 2224/04105; H01L 2224/12105; H01L 2224/131; H01L 2224/16227; H01L 2224/16235; H01L 2224/2518; H01L 2224/32225; H01L 2224/73204; H01L 2224/92125; H01L 2225/06541; H01L 2225/1035; H01L 2225/1041; H01L 2225/1058; H01L 2924/10253; H01L 2924/1434; H01L 2924/15311; H01L 2924/157

See application file for complete search history.

(56) References Cited

U.S. PATENT DOCUMENTS

| | | | |
|---|---|---|---|
| 9,224,647 B2 | 12/2015 | Koo et al. | |
| 9,349,708 B2 | 5/2016 | Fu et al. | |
| 9,653,391 B1* | 5/2017 | Yew | H01L 23/5389 |
| 2002/0139578 A1* | 10/2002 | Alcoe | H01L 24/17 |
| | | | 174/262 |
| 2003/0090884 A1 | 5/2003 | Lee et al. | |
| 2009/0309212 A1* | 12/2009 | Shim | H01L 21/568 |
| | | | 257/E23.012 |
| 2013/0062761 A1* | 3/2013 | Lin | H01L 21/565 |
| | | | 257/737 |
| 2014/0091473 A1* | 4/2014 | Len | H01L 21/4853 |
| | | | 438/118 |
| 2014/0103488 A1* | 4/2014 | Chen | H01L 24/19 |
| | | | 257/532 |
| 2014/0175665 A1 | 6/2014 | Kang | |
| 2015/0357307 A1 | 12/2015 | Fu et al. | |
| 2015/0364454 A1 | 12/2015 | Zhai et al. | |
| 2016/0013144 A1* | 1/2016 | Chen | H01L 23/49838 |
| | | | 257/774 |
| 2016/0358889 A1 | 12/2016 | Lai et al. | |
| 2016/0365324 A1 | 12/2016 | Kim et al. | |
| 2017/0062383 A1 | 3/2017 | Yee et al. | |
| 2017/0263518 A1 | 9/2017 | Yu et al. | |
| 2017/0317053 A1 | 11/2017 | Hung et al. | |
| 2017/0338175 A1* | 11/2017 | Liu | H01L 23/49827 |
| 2018/0102298 A1 | 4/2018 | Chen et al. | |

FOREIGN PATENT DOCUMENTS

| | | |
|---|---|---|
| CN | 104064551 A | 9/2014 |
| KR | 10-2011-0048733 A | 5/2011 |
| KR | 10-2016-0060380 A | 5/2016 |

OTHER PUBLICATIONS

EP 17195021.5, Jul. 16, 2018, Extended European Search Report.
CN 201810148466.4, Jun. 10, 2019, Chinese Office Action.
Extended European Search Report dated Jul. 16, 2018 in connection with European Application No. 17195021.5.
Chinese Office Action dated Jun. 10, 2019 for Chinese Application No. 201810148466.4, and English translation thereof.
Jin et al., Next generation eWLB (embedded wafer level BGA) packaging. 2010 12th Electronics Packaging Technology Conference Dec. 8, 2010; 520-26.

* cited by examiner

SEMICONDUCTOR DEVICE

This application is a Division of U.S. application Ser. No. 15/722,315, filed Oct. 2, 2017, which claims the benefit of U.S. Provisional Application Ser. No. 62/404,805, filed Oct. 6, 2016, U.S. Provisional Application Ser. No. 62/404,808, filed Oct. 6, 2016, U.S. Provisional Application Ser. No. 62/404,811, filed Oct. 6, 2016, and of U.S. Provisional Application Ser. No. 62/460,122, filed Feb. 17, 2017, each of which is incorporated herein by reference in its entirety.

FIELD OF THE INVENTION

The invention relates to a semiconductor device, and more particularly to a semiconductor device having redistribution layer (RDL) structure.

BACKGROUND OF THE INVENTION

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

Package-on-package (PoP) is now the fastest growing semiconductor package technology since it is a cost-effective solution to high-density system integration in a single package. In a PoP structure, various packages are integrated in a single semiconductor package to reduce the size.

However, PoP has a large size due to large volume of the molding compound, and the number of I/O contact is also less.

SUMMARY OF THE INVENTION

In one embodiment of the invention, a semiconductor device is provided. The semiconductor device includes a substrate, a body structure and an electronic component. The body structure is disposed above the substrate and includes a semiconductor die, a molding compound, a conductive component and a lower redistribution layer (RDL). The semiconductor die has an active surface. The molding compound encapsulates the semiconductor die and has a lower surface, an upper surface opposite to the lower surface and a through hole extending to the upper surface from the lower surface. The conductive component is formed within the through hole. The lower RDL is formed on the lower surface of the molding compound, the active surface of the semiconductor die and the conductive component exposed from the lower surface. The electronic component is disposed above the upper surface of the molding compound and electrically connected to the lower RDL through the conductive component.

In another embodiment of the invention, a semiconductor device is provided. The semiconductor device includes a molding substrate and an electronic component. The molding substrate includes a first molding compound, a first upper RDL, a lower RDL and a first conductive component. The first molding compound has an upper surface, a lower surface and a first through hole extending to the lower surface from the upper surface. The first upper RDL is formed on the upper surface of the first molding compound. The lower RDL is formed on the lower surface of the first molding compound. The first conductive component is formed within the first through hole and connects the lower RDL to the first upper RDL. The electronic component is disposed on the first upper RDL.

In another embodiment of the invention, a semiconductor device is provided. The semiconductor device includes a lower RDL, a body structure and a second molding compound. The body structure is disposed on the lower RDL and includes a silicon interposer, an electronic component and a first molding compound. The electronic component is disposed on the silicon interposer. The first molding compound encapsulates the electronic component and the silicon interposer. The second molding compound is formed on the lower RDL encapsulates the body structure.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
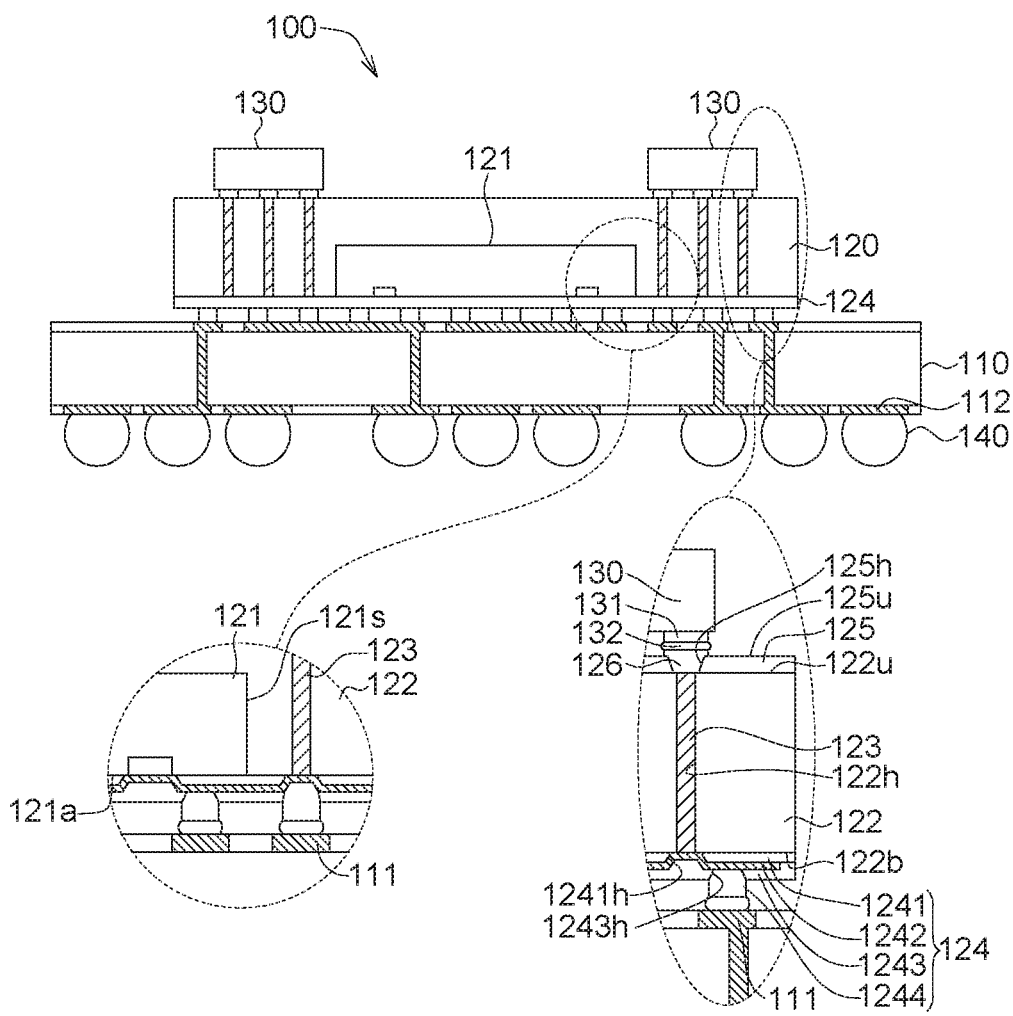
FIG. 1A illustrates a diagram of a semiconductor device according to an embodiment of the invention.
Figure 1B:
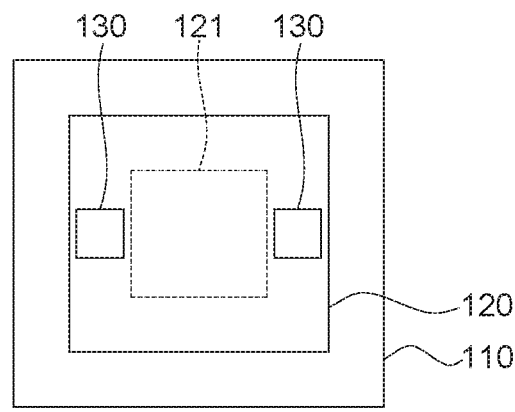
FIG. 1B illustrates a top view of the semiconductor device of FIG. 1A.

FIG. 1A illustrates a diagram of a semiconductor device 100 according to an embodiment of the invention, and FIG. 1B illustrates a top view of the semiconductor device 100 of FIG. 1A.

The semiconductor device 100 includes a substrate 110, a body structure 120, at least one electronic component 130 and a plurality of conductive contacts 140.

The substrate 110 is, for example, a multi-layered careless substrate or a core-based substrate. The substrate 110 includes a plurality of upper pads 111 and a plurality of lower pads 112 electrically connected to the upper pads 111 through vias. The lower pads 112 are electrically connected to the conductive contacts 140, and the upper pads 111 are electrically connected to the body structure 120. The substrate 110 may be electrically connected to an exterior electronic device (not illustrated) through the conductive contacts 140. In addition, the substrate 110 may be formed of by semiconductor materials such as silicon, or organic materials such as bismaleimide triazine (BT), polyimide or Ajinomoto build-up film (ABF).

The body structure 120 is disposed above the substrate 110 and includes at least one semiconductor die 121, a molding compound 122, at least one conductive component 123, a lower redistribution layer (RDL) 124, a upper passivation layer 125 and at least one conductive contact 126.

The semiconductor die 121 may be formed by a silicon wafer, and thus the semiconductor die 121 is a silicon die. The semiconductor die 121 is a die not packaged, for example. In an embodiment, the semiconductor die 121 is, for example, a SOC (System on Chip) and has an active surface 121a facing the RDL 124.

The molding compound 122 may be made of different material from that of the substrate 110. The molding compound 122 encapsulates the semiconductor die 121 and has a lower surface 122b, an upper surface 122u opposite to the lower surface 122b and at least one through hole 122h extending to the upper surface 122u from the lower surface 122b. The conductive components 123 are formed by filling the through holes 122h with conductive material, such as metal.

The molding compound 122 may be formed of an epoxy, a resin, a moldable polymer, or the like. The molding compound 122 may be applied while substantially liquid, and then may be cured through a chemical reaction, such as in an epoxy or resin. In some other embodiments, the molding compound 122 may be an ultraviolet (UV) or thermally cured polymer applied as a gel or malleable solid capable of being disposed around the semiconductor die, and then may be cured through a UV or thermal curing process. The molding compound may be cured with a mold (not shown).

The lower RDL 124 is formed on the lower surface 122b of the molding compound 122, the active surface 121a of the semiconductor die 121 and the conductive components 123 exposed from the lower surface 122b.

The lower RDL 124 extends beyond a lateral surface 121s of the semiconductor die 121 to form a fan-out structure. The lower RDL 124 includes a lower dielectric layer 1241, a lower conductive layer 1242, a lower passivation layer 1243 and at least one conductive contact 1244. In another embodiment, the lower RDL 124 may include more layer structures, such as dielectric layer, conductive layer, etc.

The lower dielectric layer 1241 is formed on the lower surface 122b and has at least one lower opening 1241h exposing the conductive component 123. The lower conductive layer 1242 is formed on the lower dielectric layer 1241 and laterally extends beyond the lateral surface 121s of the semiconductor die 121 to be electrically connected to the conductive components 123 through the lower opening 1241h. The lower passivation layer 1243 covers the lower conductive layer 1242 and has at least one lower opening 1243h exposing the lower conductive layer 1242, and each conductive contact 1244 is formed within the corresponding lower opening 1243h for electrically connected to the lower conductive layer 1242 through the corresponding lower opening 1243h. In addition, the conductive contact 1244 may be solder ball, conductive pillar, conductive bump, etc. Due to the design of the RDL, the conductive contact 1244 may be micro pillar or micro pad, and accordingly I/O contacts of the body structure 120 may be increased, and the size of the semiconductor device 100 can be more compact.

The upper passivation layer 125 covers the upper surface 122u of the molding compound 122 and has at least one upper opening 125h exposing the corresponding conductive component 123. Each conductive contact 126 is formed within the corresponding upper opening 125h to be electrically connected to the corresponding conductive component 123.

Each electronic component 130 has at least one conductive contact 131, and the electronic component 130 is disposed on the upper conductive pad 126 by the conductive contact 131 through a solder 132. The conductive contact 131 is, for example, solder ball, conductive pillar, conductive bump, etc. Since the upper conductive pad 126 projects from an upper surface 125u of the upper passivation layer 125 and provides a large area, it can increase the reliability of the connecting between the upper conductive pad 126 and the conductive contact 131.

The electronic components 130 are disposed above the upper surface 122u of the molding compound 122 and electrically connected to the substrate 110 through the conductive components 123 and the lower RDL 124. In one embodiment, the electronic component 130 is, for example, High Bandwidth Memory (HBM) or other suitable memory components. In another embodiment, the electronic component 130 may have the structure similar or the same as that of the semiconductor die 121.

As illustrated in FIGS. 1A and 1B, the electronic components 130 do not overlap the semiconductor die 121 in a stack direction of the electronic component 130 and the semiconductor die 121 (that is, up and down). The number of the electronic components 130 may be plural or one. As long as the electronic components 130 can be electrically connected to the conductive components 123, the electronic components 130 may be disposed on any positions of the upper surface 122u of the molding compound 122.

Figure 2:
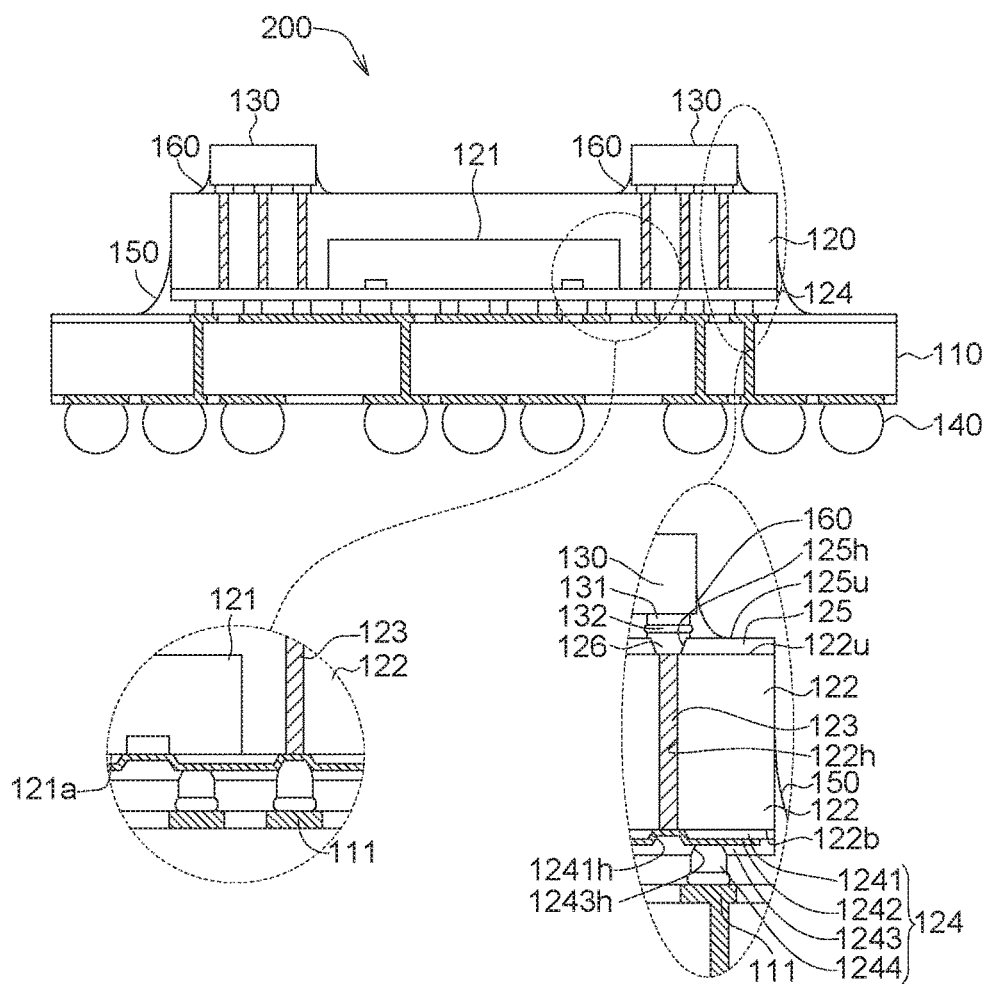
FIG. 2 illustrates a diagram of a semiconductor device according to another embodiment of the invention.

FIG. 2 illustrates a diagram of a semiconductor device 200 according to another embodiment of the invention.

The semiconductor device 200 includes the substrate 110, the body structure 120, at least one an electronic component 130, at least one conductive contact 140, a first underfill 150 and a plurality of second underfills 160.

The first underfill 150 is formed between the body structure 120 and the substrate 110 to encapsulate the lower RDL 124. The second underfill 160 is formed between the electronic component 130 and the body structure 120 to encapsulate the conductive contacts 131 and upper conductive pads 126.

Figure 3A:
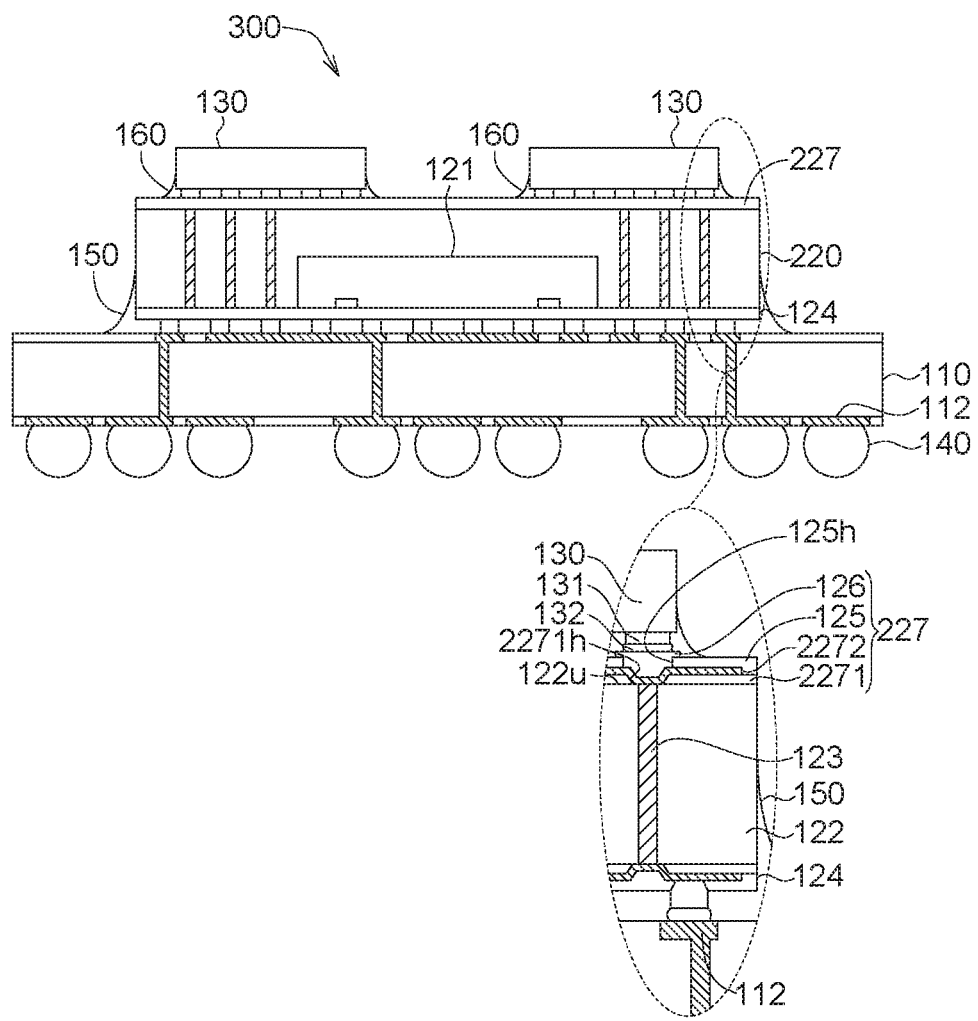
FIG. 3A illustrates a diagram of a semiconductor device according to another embodiment of the invention.
Figure 3B:
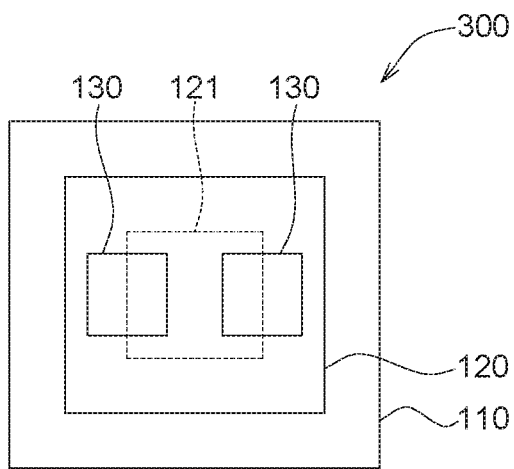
FIG. 3B illustrates a top view of the semiconductor device of FIG. 3A.

FIG. 3A illustrates a diagram of a semiconductor device 300 according to another embodiment of the invention, and FIG. 3B illustrates a top view of the semiconductor device 300 of FIG. 3A.

The semiconductor device 300 includes the substrate 110, the body structure 220, at least one electronic component 130, at least one conductive contact 140, the first underfill 150 and the second underfill 160.

In the present embodiment, the body structure 220 is disposed above the substrate 110 and includes the semiconductor die 121, the molding compound 122, at least one conductive component 123, the lower RDL 124 and an upper RDL 227.

The upper RDL 227 is formed on the upper surface 122u of the molding compound 122 and the conductive components 123 exposed from the upper surface 122u. Due to the upper RDL 227 being formed over the semiconductor die 121, the electronic component 130 can be connected to the upper RDL 227 right above the semiconductor die 121 by way of the electronic component 130 overlapping the semiconductor die 121 up and down.

As illustrated in FIG. 3B, the electronic components 130 overlap the semiconductor die 121 up and down. In another embodiment, one or some of the electronic components 130 may not overlap the semiconductor die 121 while another or the others of the electronic components 130 may overlap the semiconductor die 121 up and down.

The upper RDL 227 can provide fine pitch between the adjacent two upper conductive pads 126, and accordingly a pitch between adjacent two conductive contacts 131 also can be designed as fine pitch. As a result, it provides more input/output contacts in the electronic component 130.

The upper RDL 227 includes an upper dielectric layer 2271, an upper conductive layer 2272, an upper passivation layer 125 and at least one upper conductive pad 126. The upper dielectric layer 2271 is formed on the upper surface 122u and has at least one upper opening 2271h exposing the corresponding conductive component 123. The upper conductive layer 2272 is formed on the upper dielectric layer 2271 to be electrically connected to the conductive component 123 through the corresponding upper opening 2271h. The upper passivation layer 125 covers the upper conductive layer 2272 and has at least one upper opening 125h exposing the upper conductive layer 2272. Each conductive contact 126 is formed within the corresponding upper opening 125h to be electrically connected to the upper conductive layer 2272.

In another embodiment, the upper RDL 227 may include more layer structures, such as dielectric layer, conductive layer, etc.

Figure 4A:
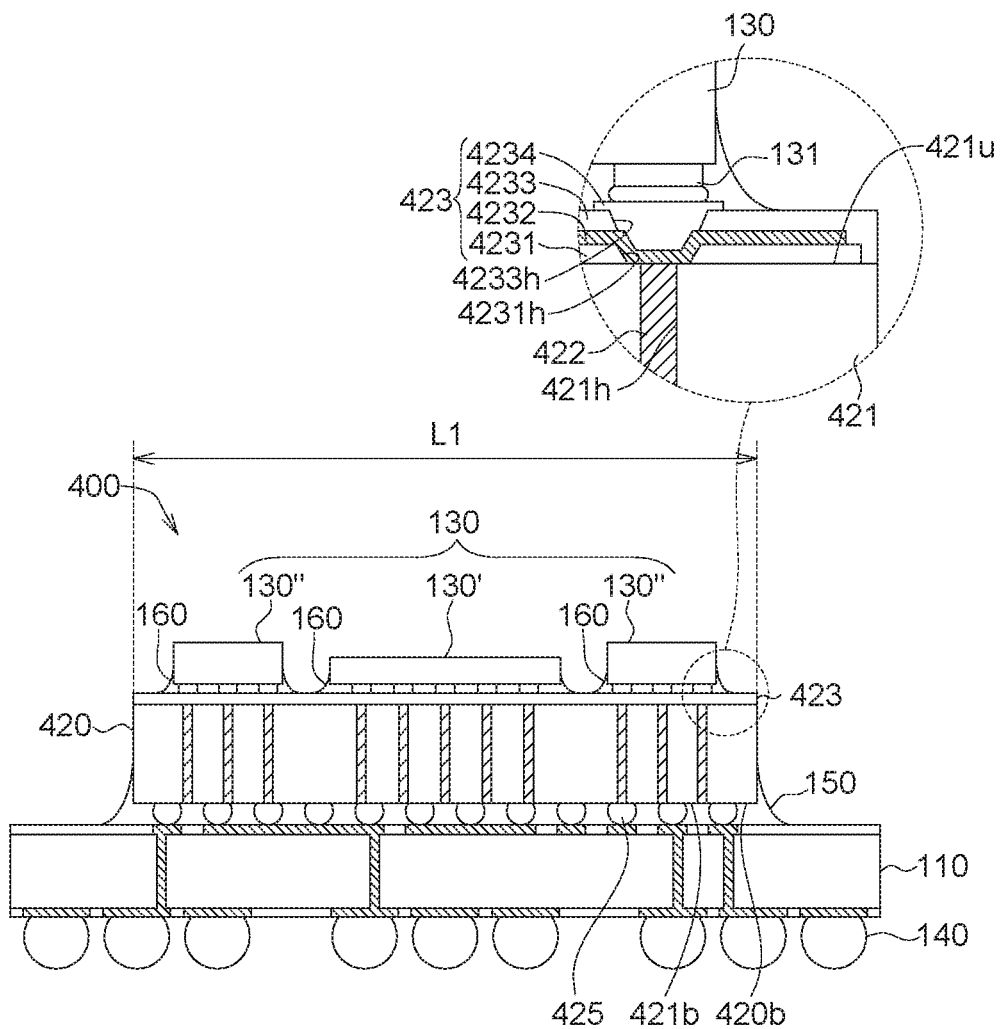
FIG. 4A illustrates a diagram of a semiconductor device according to another embodiment of the invention.
Figure 4B:
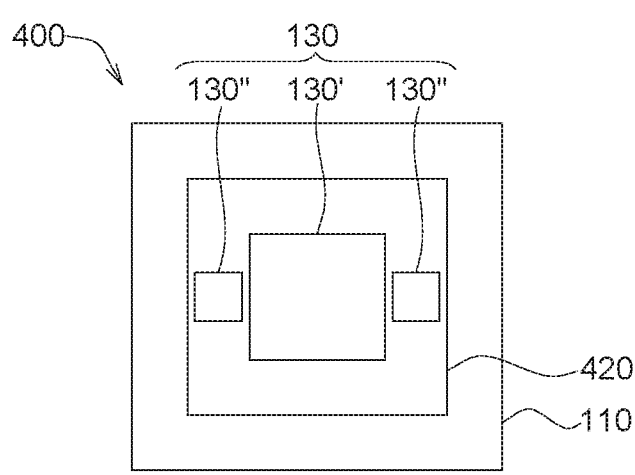
FIG. 4B illustrates a top view of the semiconductor device of FIG. 4A.

FIG. 4A illustrates a diagram of a semiconductor device 400 according to another embodiment of the invention, and FIG. 4B illustrates a top view of the semiconductor device 400 of FIG. 4A.

The semiconductor device 400 includes the substrate 110, the silicon interposer 420, at least one an electronic component 130, a plurality of conductive contacts 140, the first underfill 150 and the second underfills 160.

The silicon interposer 420 is electrically connected to the substrate 110 through at least one conductive contact 425 disposed between a lower surface 420b of the silicon interposer 420 and the substrate 110. The conductive contact 425 may be solder ball, conductive pillar, conductive bump, etc.

The silicon interposer 420 is disposed above the substrate 110 and includes a silicon substrate 421, at least one conductive component 422 and an upper RDL 423. The silicon substrate 421 has a lower surface 421b, an upper surface 421u opposite to the lower surface 421b and at least one through hole 421h extending to the lower surface 421b from the upper surface 421u. Each conductive component 422 is formed within the corresponding through hole 421h. In the present embodiment, the through hole 421h is through-silicon via (TSV), for example.

The upper RDL 423 is formed on the upper surface 421u of the silicon substrate 421 and the conductive components 422 exposed from the upper surface 421u. The electronic components 130 are disposed above the upper RDL 423 and electrically connected to the upper RDL 423. In the present embodiment, the electronic components 130 may include at least one SoC 130', at least one HEM 130" or other suitable electronic component.

The upper RDL 423 includes an upper dielectric layer 4231, an upper conductive layer 4232, an upper passivation layer 4233 and at least one upper conductive pad 4234. The upper dielectric layer 4231 is formed on the upper surface 421u and has at least one upper opening 4231h exposing the corresponding conductive component 422. The upper conductive layer 4232 is formed on the upper dielectric layer 4231 to be electrically connected to the conductive components 422 through the corresponding upper openings 4231h. The passivation layer 4233 covers the conductive layer 4232 and has at least one upper opening 4233h exposing the upper conductive layer 4232. Each conductive contact 4234 is formed within the corresponding upper opening 4233h to be electrically connected to the upper conductive layer 4232. Due to the design of the upper RDL 423, the conductive contact 131 of the electronic component 130 may be micro pillar or micro pad, and accordingly it provides more input/output contacts in the electronic component 130.

Figure 5A:
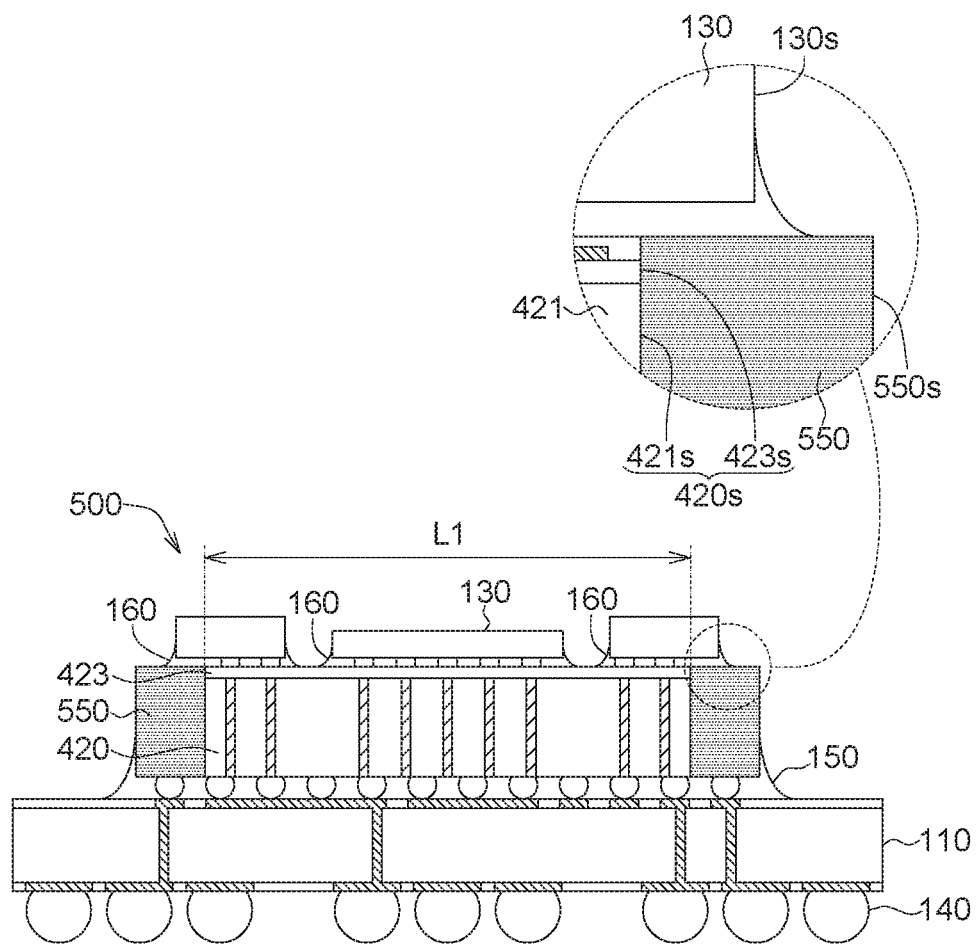
FIG. 5A illustrates a diagram of a semiconductor device according to another embodiment of the invention.
Figure 5B:
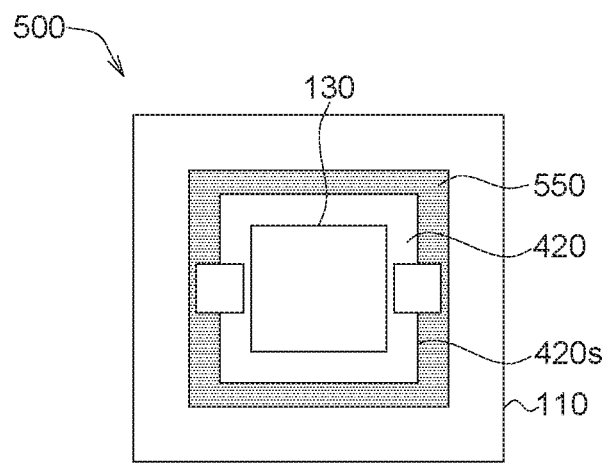
FIG. 5B illustrates a top view of the semiconductor device of FIG. 5A.

FIG. 5A illustrates a diagram of a semiconductor device 500 according to another embodiment of the invention, and FIG. 5B illustrates a top view of the semiconductor device 500 of FIG. 5A.

The semiconductor device 500 includes the substrate 110, the silicon interposer 420, at least one an electronic component 130, a plurality of conductive contacts 140, the first underfill 150, the second underfills 160 and a surrounding component 550.

The surrounding component 550 is formed on and surrounds an outer lateral surface 420s of the silicon interposer 420. The outer lateral surface 420s is defined by an outer lateral surface 423s of the upper RDL 423 and an outer lateral surface 421s of the silicon substrate 421, wherein the outer lateral surface 423s is aligned with the outer lateral surface 421s.

In comparison with the semiconductor device 400, the silicon substrate 421 of the semiconductor device 500 has a shorter length L1 than the length L1 of the silicon substrate 421 of the semiconductor device 400, and accordingly it can reduce the cost of the silicon substrate 421 of semiconductor device 500. In detail, the surrounding component 550 may be made of molding compound material as described above. The molding compound material is cheaper than the silicon wafer, and accordingly it can reduce the cost of the silicon substrate 421 of semiconductor device 500.

In the present embodiment, the electronic component 130 has an outer lateral surface 130s located between an outer lateral surface 550s of the surrounding component 550 and the outer lateral surface 420s of the silicon interposer 420. In other words, the electronic component 130 overlaps the surrounding component 550 in the stack direction.

Figure 6:
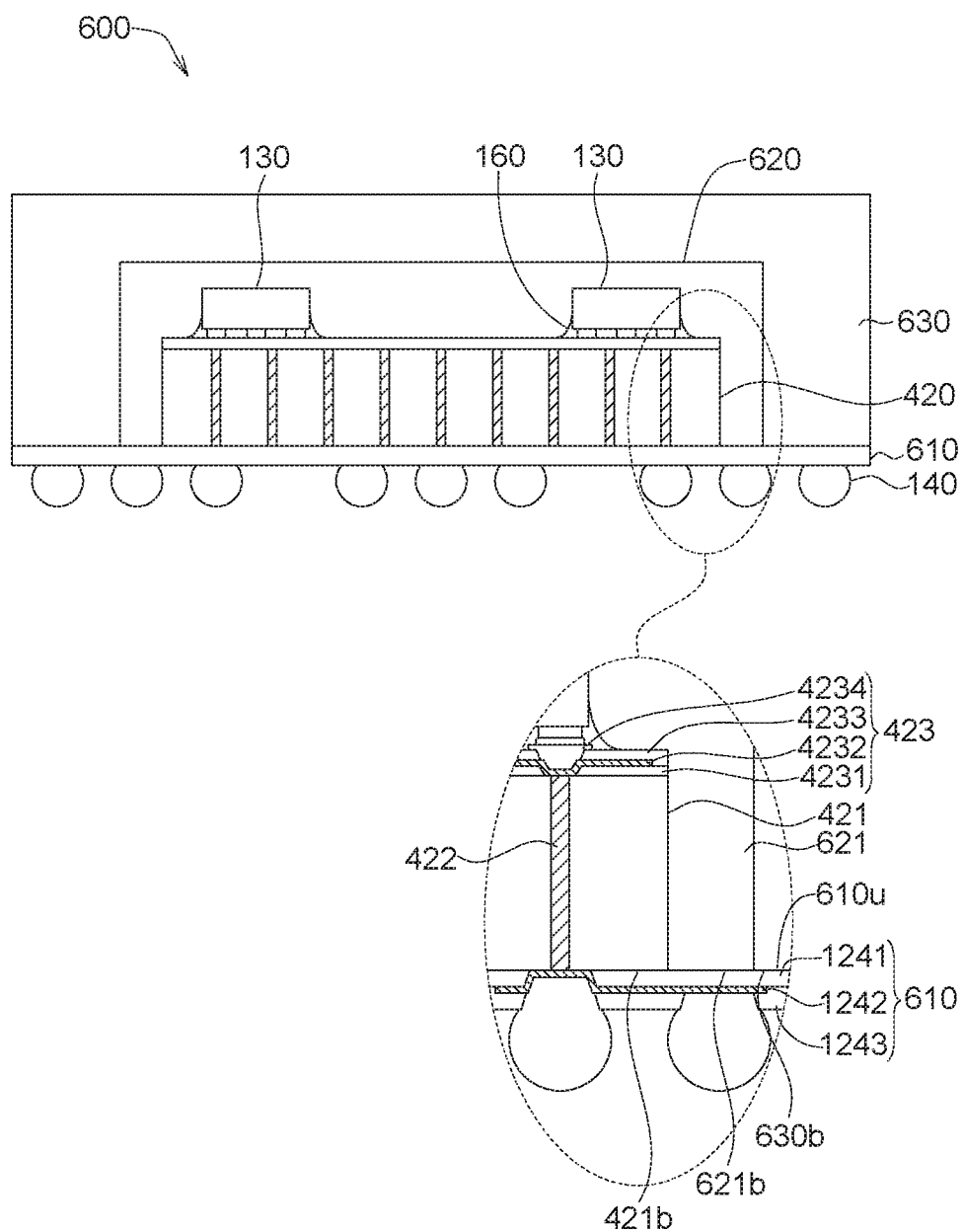
FIG. 6 illustrates a diagram of a semiconductor device according to another embodiment of the invention.

FIG. 6 illustrates a diagram of a semiconductor device 600 according to another embodiment of the invention.

The semiconductor device 600 includes a lower RDL 610, a body structure 620, a second molding compound 630 and at least one conductive contact 140.

In the present embodiment, the lower RDL 610 is, for example, similar to or the same as the lower RDL 124 described above. The lower RDL 610 is directly connected to a lower surface 421b of the silicon substrate 421, a lower surface 621b of the first molding compound 621 and a lower surface 630b of the second molding compound 630. The lower RDL 610 is directly electrically connected to the body structure 620 without any conductive contact (for example, solder ball, conductive pillar, conductive bump, etc.) formed between the body structure 620 and the lower RDL 610.

The body structure 620 is, for example, a 2.5D structure. The body structure 620 includes at least one electronic component 130, at least one second underfill 150, the silicon interposer 420 and a first molding compound 621. The silicon interposer 420 is disposed on the lower RDL 610 and includes the silicon substrate 421, at least one conductive component 422 and the upper RDL 423, as described above. The first molding compound 621 encapsulates the silicon interposer 420, the electronic components 130 and the second underfills 150. The second molding compound 630 is formed on an upper surface 610u of the lower RDL 610 and encapsulates the body structure 620.

In the present embodiment, the lower RDL 610 and the body structure 620 are combined after the body structure 620 is encapsulated by the second molding compound 630, and such method calls "RDL last" or "Die first".

Figure 7:
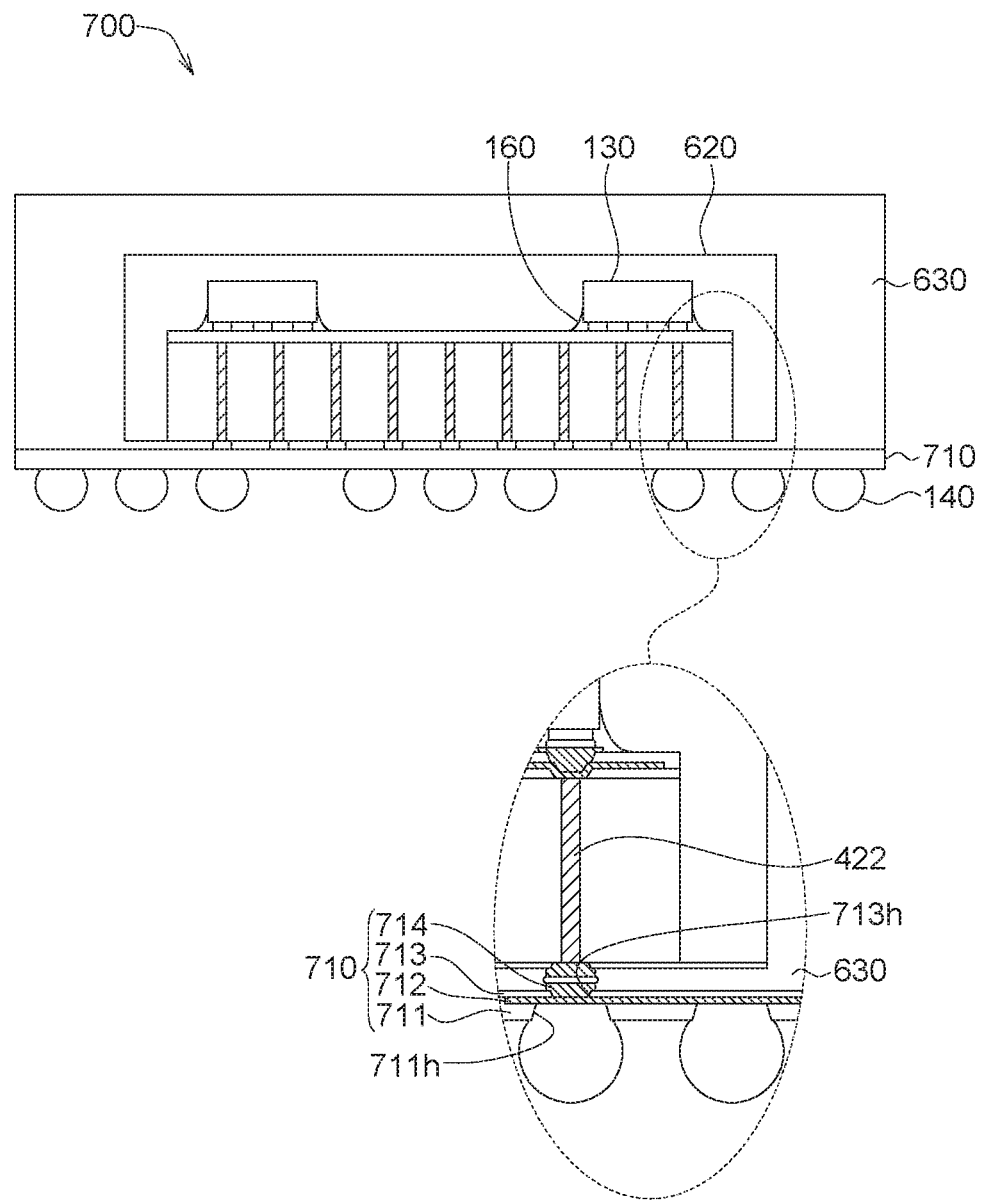
FIG. 7 illustrates a diagram of a semiconductor device according to another embodiment of the invention.

FIG. 7 illustrates a diagram of a semiconductor device 700 according to another embodiment of the invention. The semiconductor device 700 includes a lower RDL 710, the body structure 620, a second molding compound 630 and at least one conductive contact 140. In another embodiment, the body structure 620 may be omitted.

In the present embodiment, the second molding compound 630 is formed between the body structure 620 and the lower RDL 710.

The lower RDL 710 includes a first lower passivation layer 711, a lower conductive layer 712, a second lower passivation layer 713 and at least one conductive pad 714. The first lower passivation layer 711 is formed below the lower conductive layer 712 and has at least one lower opening 711h to expose a lower surface of the lower conductive layer 712. The second lower passivation layer 713 is formed above the lower conductive layer 712 and has at least one lower opening 713h to expose an upper surface of the lower conductive layer 712. Each conductive pad 714 is formed within the corresponding lower opening 713h, for electrically connected to the corresponding conductive component 422.

In the present embodiment, the lower RDL 710 and the body structure 620 are combined after the lower RDL 710 is formed, and such method calls "RDL first" or "Die last"

Figure 8:
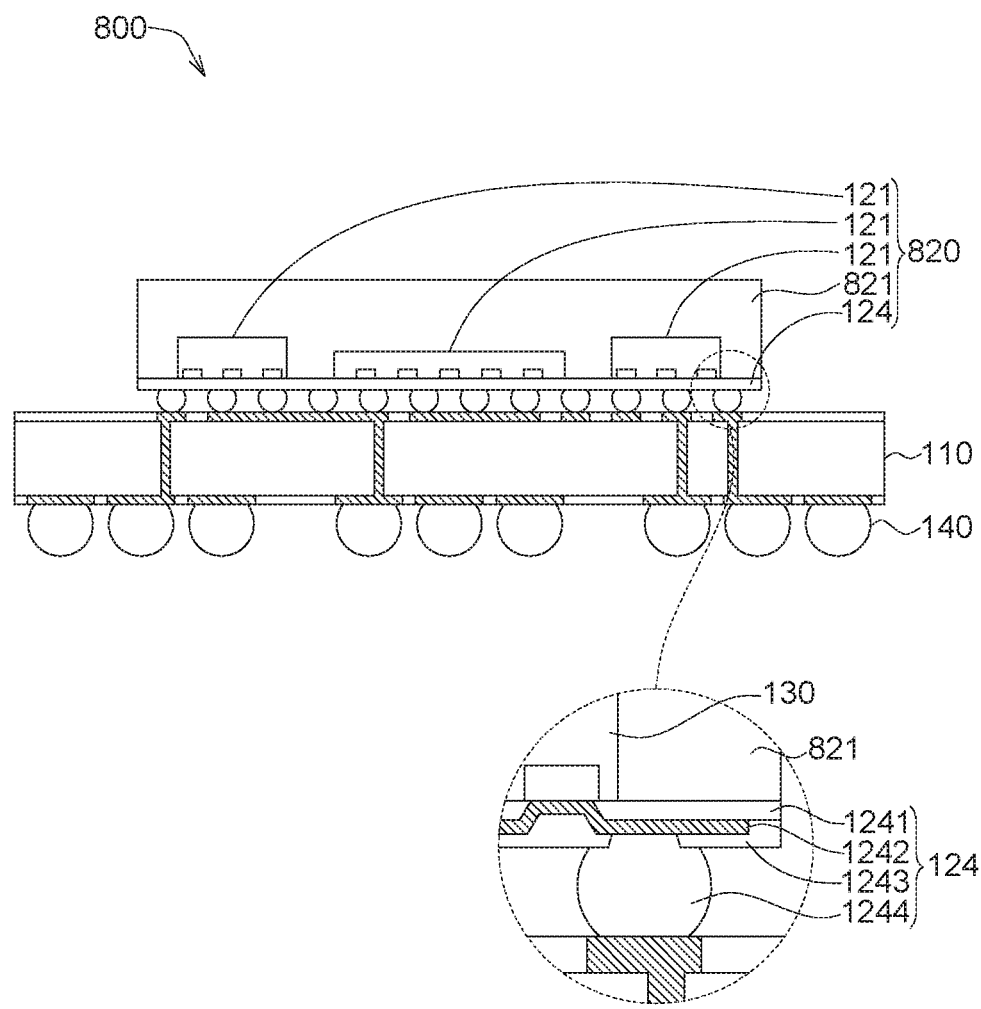
FIG. 8 illustrates a diagram of a semiconductor device according to another embodiment of the invention.

FIG. 8 illustrates a diagram of a semiconductor device 800 according to another embodiment of the invention. The semiconductor device 800 includes the substrate 110, a body structure 820 and at least one conductive contact 140.

The body structure 820 is disposed on the substrate 110 and includes the lower AOL 124, at least one semiconductor die 121 and a molding compound 821. The semiconductor dies 121 are disposed on the lower RDL 124. The conductive contacts 1244 of the lower RDL 124 are disposed between the substrate 110 and the lower passivation layer 1243 of the lower RDL 124 for being electrically connecting the lower conductive layer 1242 of the lower RDL 124 to the substrate 110. In the present embodiment, the conductive contacts 1244 is, for example, solder ball.

In the present embodiment, the lower RDL 124 is formed below the semiconductor dies 121 and the molding compound 821, and directly connected to the semiconductor dies 121 without any conductive contact (for example, solder ball, conductive pillar, conductive bump, etc.) formed between the semiconductor dies 121 and the lower RDL 124.

In the present embodiment, the lower RDL 124 and the semiconductor dies 121 are combined after the semiconductor dies 121 are encapsulated by the molding compound 821, and such method calls "RDL last" or "Die first".

Figure 9:
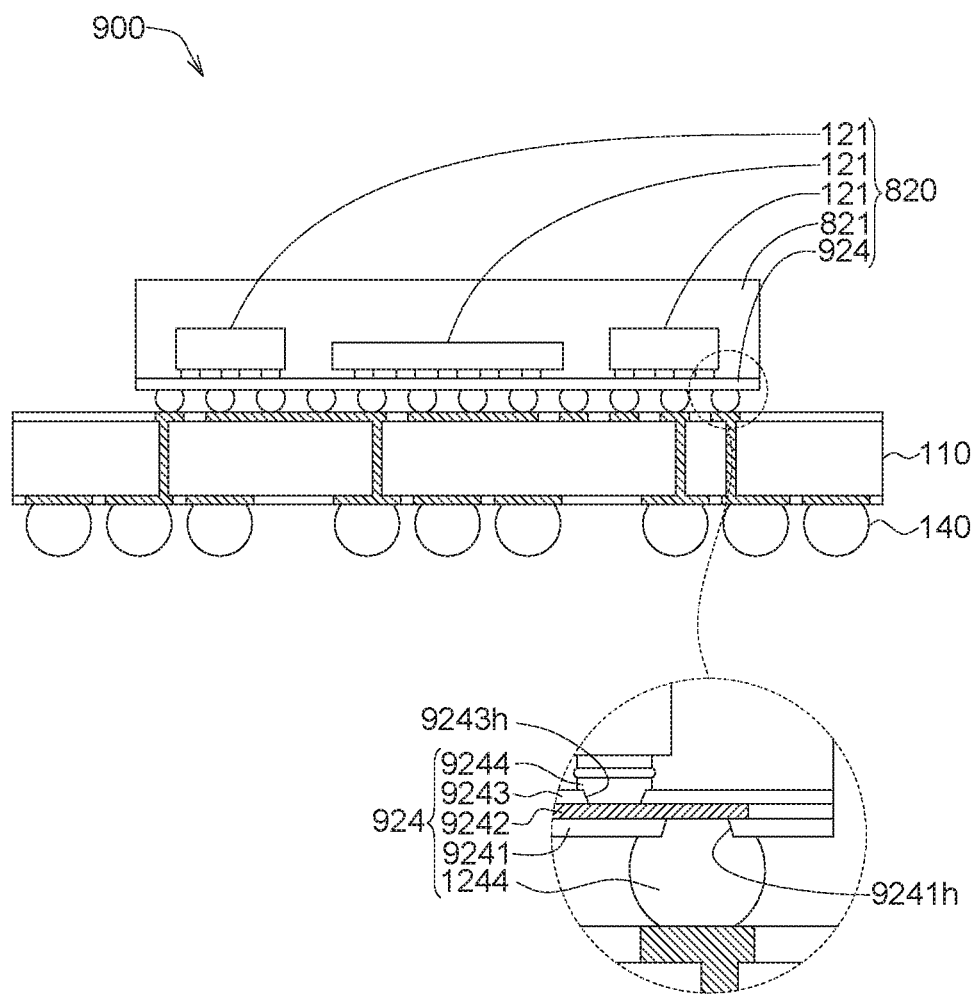
FIG. 9 illustrates a diagram of a semiconductor device according to another embodiment of the invention.

FIG. 9 illustrates a diagram of a semiconductor device 900 according to another embodiment of the invention. The semiconductor device 900 includes the substrate 110, at least one conductive contact 140 and a body structure 920.

The body structure 920 is disposed on the substrate 110 and includes a lower RDL 924, at least one semiconductor die 121 and a molding compound 821. The semiconductor dies 121 are disposed on the lower RDL 924.

The lower RDL 924 includes a first lower passivation layer 9241, a lower conductive layer 9242, a second lower passivation layer 9243, at least one conductive pad 9244 and at least one conductive contact 1244.

The lower conductive layer 9242 is formed between the first lower passivation layer 9241 and the second lower passivation layer 9243. The first lower passivation layer 9241 has at least one lower opening 9241h to expose a lower surface of the lower conductive layer 9242, and the second lower passivation layer 9243 has at least one opening 9243h to expose an upper surface of the lower conductive layer 9242. Each conductive pad 9244 is formed within the corresponding lower opening 9243h, and each conductive contact 822 is formed within the corresponding opening 9241h.

In the present embodiment, the lower RDL 924 and the semiconductor dies 121 are combined after the lower RDL 924 is formed, and such method calls "RDL first" or "Die last".

Figure 10:
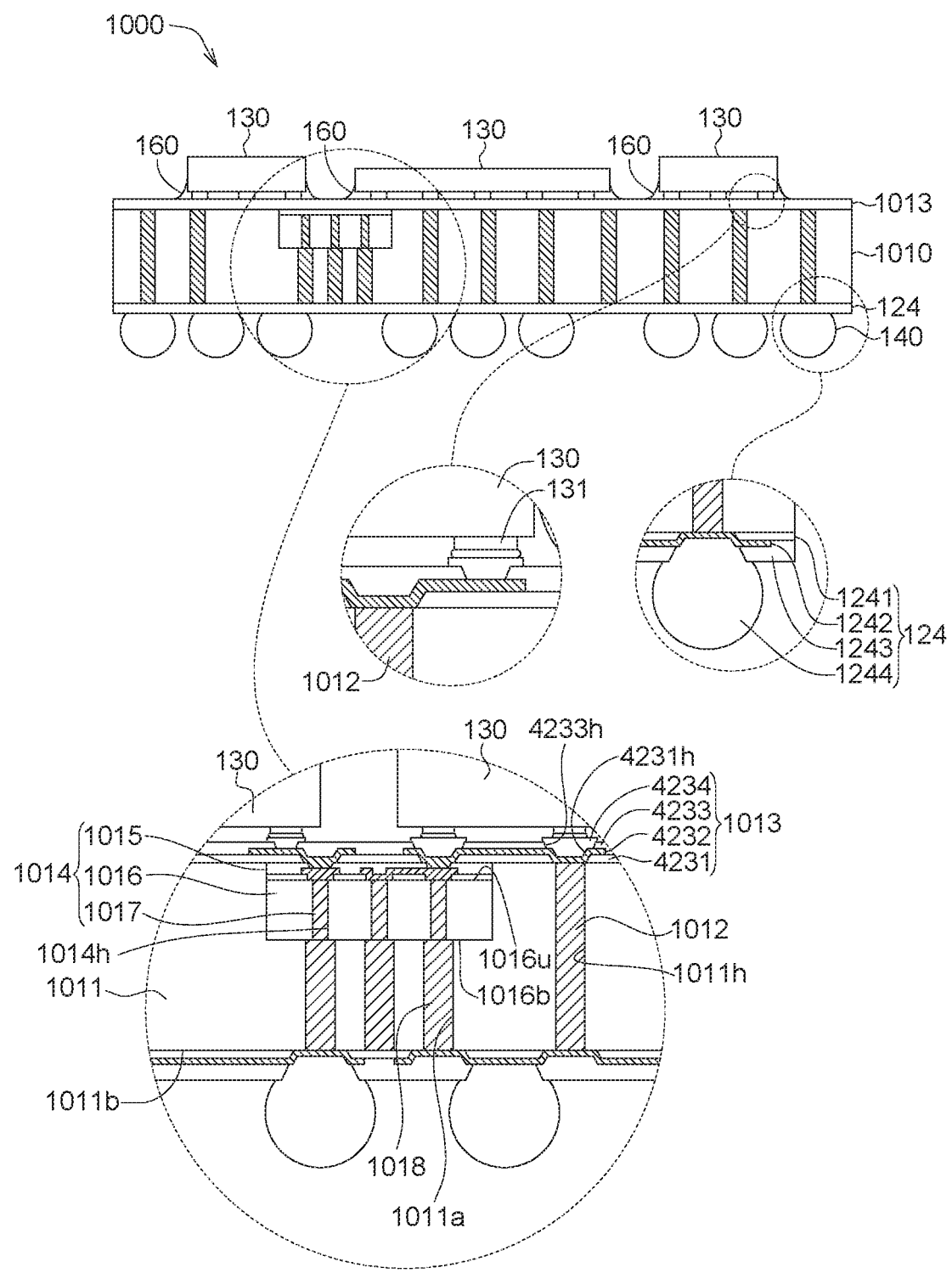
FIG. 10 illustrates a diagram of a semiconductor device according to another embodiment of the invention.

FIG. 10 illustrates a diagram of a semiconductor device 1000 according to another embodiment of the invention. The semiconductor device 1000 includes the molding substrate 1010, at least one semiconductor die 121, at least one conductive contact 140 and at least one second underfill 160.

The molding substrate 1010 includes a first molding compound 1011, at least one first conductive component 1012, a first upper RDL 1013, a semiconductor die 1014, the lower RDL 124 and the second underfills 160. The first upper RDL 1013 has the structures similar to or the same as that of the upper RDL 423 as described above.

The first molding compound 1011 has an upper surface 1011u, a lower surface 1011b and at least one first through hole 1011h extending to the lower surface 1011b from the upper surface 1011u. Each first conductive component 1012 is formed within the corresponding first through hole 1011h and connects the lower RDL 124 to the first upper RDL 1013. The first upper RDL 1013 is formed on the upper surface 1011u. The lower RDL 124 is formed on the lower surface 1011b. The semiconductor dies 121 are disposed on the first upper RDL 1013.

The first upper RDL 1013 includes the upper dielectric layer 4231, the upper conductive layer 4232, the upper passivation layer 4233 and at least one conductive pad 4234. The upper dielectric layer 4231 has at least one upper opening 4231h exposing the first through holes 1011h and a second upper RDL 1015 of the semiconductor die 1014. The upper conductive layer 4232 is formed on the first conductive components 1012 and the second upper RDL 1015 of the semiconductor die 1014 through the upper openings 4231h.

The semiconductor die 1014 may be formed by a silicon wafer, and thus the semiconductor die 1014 is a silicon die. The semiconductor die 1014 is embedded in the first molding compound 1011 of the molding substrate 1010 and includes a second upper RDL 1015, a silicon substrate 1016, at least one second conductive component 1017.

The silicon substrate 1016 has an upper surface 1016u and a lower surface 1016u opposite to the upper surface 1016u. The semiconductor die 1014 has a second through hole 1014h extending to the lower surface 1016b from the upper surface 1016u. Each second conductive component 1017 is formed within the corresponding second through hole 1014h. The first molding compound 1011 has a blind hole 1011a extending to the second conductive component 1017 from the lower surface 1011b of the first molding compound 1011. The molding substrate 1010 further includes at least third conductive component 1018 formed within the blind hole 1011a to electrically connect the corresponding second conductive component 1017 to the lower RDL 124. The semiconductor die 1014 can provide the molding substrate 1010 with more I/O density, trace density and various routing designs. In another embodiment, the semiconductor die 1014 may be omitted.

Figure 11:
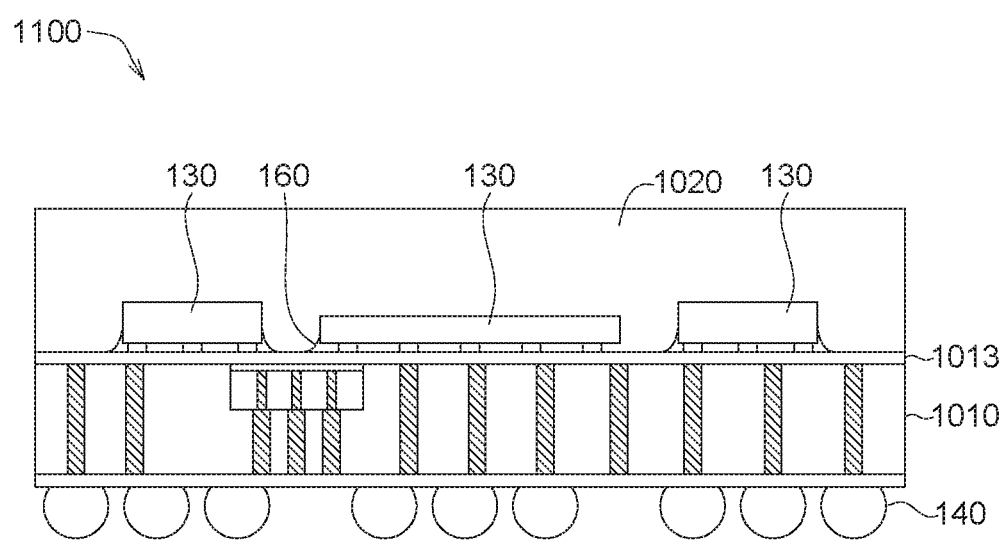
FIG. 11 illustrates a diagram of a semiconductor device according to another embodiment of the invention.

FIG. 11 illustrates a diagram of a semiconductor device 1100 according to another embodiment of the invention. The semiconductor device 1100 includes the molding substrate 1010, a second molding compound 1020, at least one semiconductor die 121, at least one conductive contact 140 and at least one second underfill 160. In the present embodiment, the second molding compound 1020 formed on the first upper RDL 1013 encapsulates the semiconductor dies 121 and the second underfills 160.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
a substrate; and
a body structure disposed above the substrate and comprising:
a semiconductor die having an active surface;
a molding compound encapsulating the semiconductor die and having a lower surface, an upper surface opposite to the lower surface and a through hole extending to the upper surface from the lower surface;
a conductive component formed within the through hole;
a lower redistribution layer (RDL) formed on the lower surface of the molding compound, the conductive component being exposed from the lower surface; and
a first electronic component disposed above the upper surface of the molding compound and electrically connected to the lower RDL through the conductive component,
wherein the molding compound is not present between the active surface of the semiconductor die and the lower RDL.

2. The semiconductor device as claimed in claim 1, wherein the body structure further comprises:
an upper RDL formed on the upper surface of the molding compound and electrically connected to the conductive component;
wherein the first electronic component partly overlaps the semiconductor die in a stack direction of the first electronic component and the semiconductor die.

3. The semiconductor device as claimed in claim 2, further comprising a second electronic component that partly overlaps the semiconductor die in a stack direction of the second electronic component and the semiconductor die.

4. The semiconductor device as claimed in claim 2, further comprising a second electronic component, wherein the second electronic component does not overlap the semiconductor die.

5. The semiconductor device as claimed in claim 2, wherein the upper RDL comprises:
an upper passivation layer having an upper surface; and
a conductive pad formed projecting from the upper surface of the upper passivation layer;
wherein the first electronic component has a first conductive contact, and the first electronic component is disposed on the conductive pad by the first conductive contact.

6. The semiconductor device as claimed in claim 5, further comprising:
an underfill between the first electronic component and the body structure, the underfill encapsulating the first conductive contact.

7. The semiconductor device as claimed in claim 5, wherein the upper RDL further comprises:
an upper conductive layer formed beneath the upper passivation layer; and
an upper dielectric layer formed between the upper conductive layer and the upper surface of the molding compound.

8. The semiconductor device as claimed in claim 7, wherein the upper dielectric layer has at least one upper opening, wherein the upper conductive layer is electrically connected to the conductive component through the at least one upper opening.

9. The semiconductor device as claimed in claim 1, wherein the first electronic component partly overlaps the semiconductor die in a stack direction of the first electronic component and the semiconductor die.

10. The semiconductor device as claimed in claim 1, wherein the lower RDL extends beyond a lateral surface of the semiconductor die to form a fan-out structure.

11. The semiconductor device as claimed in claim 10, wherein the lower RDL comprises a lower conductive layer that extends beyond the lateral surface of the semiconductor die and is electrically connected to the conductive component.

12. The semiconductor device as claimed in claim 11, wherein the lower RDL further comprises:
a lower dielectric layer formed between the lower surface of the molding compound and the lower conductive layer, the lower dielectric layer having a first lower opening that exposes the conductive component;
wherein the lower conductive layer is electrically connected to the conductive component through the first lower opening.

13. The semiconductor device as claimed in claim 12, further comprising:
a lower passivation layer formed below the lower conductive layer and having a second lower opening; and
a second conductive contact formed within the second lower opening.

14. The semiconductor device as claimed in claim 1, further comprising:
an underfill between the body structure and the substrate, wherein the first underfill encapsulates the lower RDL.

15. The semiconductor device as claimed in claim 1, wherein the substrate comprises:
a plurality of upper pads; and a plurality of lower pads electrically connected to the plurality of upper pads through vias.

16. The semiconductor device as claimed in claim 15, wherein the substrate is electrically connected to the body structure through at least one of the plurality of upper pads.

17. The semiconductor device as claimed in claim 1, wherein the first electronic component is electrically connected to the substrate through the conductive component and the lower RDL.

18. The semiconductor device as claimed in claim 1, wherein the first electronic component is a High Bandwidth Memory (HBM).

19. The semiconductor device as claimed in claim 1, wherein the semiconductor die is a System on Chip.

20. The semiconductor device as claimed in claim 1, wherein the semiconductor die is formed by a silicon wafer.

* * * * *